(12) United States Patent
Strydom

(10) Patent No.: US 10,079,604 B1
(45) Date of Patent: Sep. 18, 2018

(54) STAGGERED SWITCHING IN A LOAD DRIVER

(71) Applicant: TEXAS INSTRUMENTS INCORPORATED, Dallas, TX (US)

(72) Inventor: Johan Tjeerd Strydom, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/463,578

(22) Filed: Mar. 20, 2017

(51) Int. Cl.
*H03K 19/0185* (2006.01)
*H03K 17/284* (2006.01)
*H02P 6/14* (2016.01)

(52) U.S. Cl.
CPC ....... *H03K 19/018585* (2013.01); *H02P 6/14* (2013.01); *H03K 17/284* (2013.01); *H03K 2217/0063* (2013.01); *H03K 2217/0072* (2013.01)

(58) Field of Classification Search
CPC . H03K 19/018585; H03K 17/284; H02P 6/14
USPC .......................................................... 326/83
See application file for complete search history.

(56) References Cited

U.S. PATENT DOCUMENTS

| | | | |
|---|---|---|---|
| 3,584,308 A | 6/1971 | Neu | |
| 3,761,617 A | 9/1973 | Tsuchiya et al. | |
| 5,773,999 A | 6/1998 | Park et al. | |
| 6,097,219 A | 8/2000 | Urata et al. | |
| 6,518,800 B2 | 2/2003 | Martin et al. | |
| 6,642,742 B1 * | 11/2003 | Loyer | H03K 17/164 326/30 |
| 7,170,324 B2 | 1/2007 | Huber et al. | |
| 7,863,934 B2 | 1/2011 | Lin | |
| 8,193,960 B2 | 6/2012 | Kuramochi | |
| 8,258,820 B2 | 9/2012 | Strzalkowski | |
| 8,487,604 B2 * | 7/2013 | Ikriannikov | H01F 3/10 323/355 |
| 8,643,404 B1 | 2/2014 | Chaung et al. | |
| 8,710,810 B1 * | 4/2014 | McJimsey | H02M 3/1584 323/272 |
| 2006/0152205 A1 * | 7/2006 | Tang | H02M 3/1584 323/284 |

(Continued)

OTHER PUBLICATIONS

Office Action (8 pages) dated Oct. 13, 2017 for U.S. Appl. No. 15/245,882.

(Continued)

*Primary Examiner* — Dylan White
(74) *Attorney, Agent, or Firm* — Michael A. Davis, Jr.; Charles A. Brill; Frank D. Cimino

(57) ABSTRACT

An apparatus comprises multiple impedances and multiple pairs of transistors. Each pair connects to an impedance. Each pair includes high and low side transistors. The high side transistors and the low side transistors are connected each other and to a first terminal of the corresponding impedance, wherein second terminals of the impedances are connected to each other. The apparatus also comprises a staggered signal transistor driver to assert separate delayed high side signals to control inputs of the high side transistors. The delayed high side signals are time delayed with respect to each other. The driver asserts separate delayed low side signals to control inputs of the low side transistors.

11 Claims, 4 Drawing Sheets

(56) References Cited

U.S. PATENT DOCUMENTS

| | | | |
|---|---|---|---|
| 2008/0252240 A1* | 10/2008 | Sugie | H02P 6/08 |
| | | | 318/400.06 |
| 2009/0160412 A1* | 6/2009 | Latham | H02M 3/1588 |
| | | | 323/282 |
| 2009/0296441 A1* | 12/2009 | Klemt | H02M 1/088 |
| | | | 363/131 |
| 2012/0307526 A1 | 12/2012 | Senanayake | |
| 2013/0027009 A1* | 1/2013 | Tang | H02M 3/1584 |
| | | | 323/271 |
| 2015/0015219 A1* | 1/2015 | Ishino | H02M 3/1584 |
| | | | 323/271 |
| 2015/0077081 A1* | 3/2015 | Ejury | H02M 7/538 |
| | | | 323/282 |
| 2015/0236586 A1* | 8/2015 | Babazadeh | G01R 31/40 |
| | | | 323/272 |
| 2016/0064935 A1* | 3/2016 | Gao | H02J 3/40 |
| | | | 307/82 |
| 2016/0112042 A1 | 4/2016 | Hanson et al. | |
| 2016/0233766 A1* | 8/2016 | Todorov | H02M 3/1584 |
| 2017/0098998 A1* | 4/2017 | Zhou | H02M 3/1584 |
| 2017/0126113 A1* | 5/2017 | Ejury | H02M 1/088 |
| 2017/0288532 A1 | 10/2017 | Zhou et al. | |

OTHER PUBLICATIONS

Office Action (11 pages) dated Sep. 13, 2017 for U.S. Appl. No. 15/245,857.

* cited by examiner

US 10,079,604 B1

STAGGERED SWITCHING IN A LOAD DRIVER

BACKGROUND

Motors are used in a variety of applications. For high power systems, motors may be driven using a motor drive and a 3-phase alternating current (AC) source. The motor drive may include switches (e.g., transistors), which turn on and off to produce a desired voltage and current to drive the motor. In some cases, rapid switching times may cause the voltage and current transmitted through an electrical cable from the motor drive to the motor overshoot and/or undershoot. Such overshoot or undershoot of the motor voltages or currents may cause partial breakdown of the electrical isolation within the motor which may lead to a premature failure.

In an industrial setting, the motor may be located at a significant distance from the motor drive. The longer the cable, the higher is the likelihood that the high frequency noise generated by the switches may cause cable reflections. To avoid these cable reflections from generating over/undershoots, the devices that drive the motor and cable are switched slower to limit the voltage transition slew rate, thus resulting in a trade-off between switching time and switching loss.

SUMMARY

Some embodiments are directed to an apparatus comprising a plurality of impedances and a plurality of pairs of transistors. In such embodiments, each transistor pair connects to a corresponding one of the plurality of impedances, and each pair includes a high side transistor and a low side transistor. Each transistor includes a control input. Further, each transistor pair is connected to each other and to a first terminal of the corresponding impedance. A second terminal of each of the plurality of impedances is connected to each other to form a switching node. The apparatus also comprises a staggered signal transistor driver configured to assert separate delayed high side signals to the control inputs of the plurality of high side transistors, wherein the delayed high side signals are time-delayed with respect to each other. The staggered signal transistor driver also assert separate delayed low side signals to the control inputs of the plurality of low side transistors, wherein the delayed low side signals are time-delayed with respect to each other.

Yet other embodiments are directed to an apparatus comprising a plurality of impedance devices. The apparatus also comprises a plurality of pairs of transistors, wherein each pair connects to a corresponding one of the plurality of impedance devices. Each transistor pair also includes a high side transistor and a low side transistor. Each transistor includes a control input. Further, each transistor pair is connected to each other and to a first terminal of the corresponding impedance. A second terminal of each of the plurality of impedances is connected to each other to form a switching node.

At least some of the embodiments also are directed to a method comprising programming a time delay value into a staggered signal transistor driver. The method also comprises generating a plurality of delayed high side signals, delayed with respect to each other by the time delay value. Each of the plurality of the delayed high side signals are provided to a control input of separate high side transistor. The method further includes generating a plurality of delayed low side signals, delayed with respect to each other by the time delay value. Each of the plurality of the delayed low side signal are provided to a gate of separate low side transistor.

BRIEF DESCRIPTION OF THE DRAWINGS

For a detailed description of various examples, reference will now be made to the accompanying drawings in which.

DETAILED DESCRIPTION

During switching from a lower drain/source voltage $V_{DS}$ to a higher drain source voltage $V_{DS}$, or from a higher drain source voltage $V_{DS}$ to a lower drain/source voltage $V_{DS}$, some electrical systems may experience detrimental overshoot and undershoot of the drain/source voltage $V_{DS}$. The voltage overshoots on the rising edges and undershoots on the falling edges. The undershooting and overshooting may result because of the inherent inductance and capacitance resulting from high frequency switching of the drain/source voltage $V_{DS}$. The higher the dv/dt (also referred to as "slew rate") of $V_{DS}$, the higher the frequency components in the system. These high frequency components can propagate through an electrical system that drives a load (e.g., a motor), resulting in electromagnetic interference causing dielectric breakdown at the load.

The embodiments described herein include a converter usable to drive a load. The disclosed converter may overcome the above-described problems associated with overshooting and undershooting. The disclosed embodiments are directed towards a drive, which includes the converter, to drive electrical signals to a motor, but the principles can be applied to other types of loads besides motors. The disclosed converter includes multiple "high side" switches and multiple "low side" switches. Each switch is triggered to open and close using a separate driver at different time instances. For example, the switches are not simultaneously triggered but rather triggered one by one such that there is a time delay between two consecutively triggered switches. This triggering technique, along with employing impedances to facilitate separately triggering the switches, leads to faster switching while advantageously reducing high frequency noise at a common switch node, and at the load.

Figure 1:
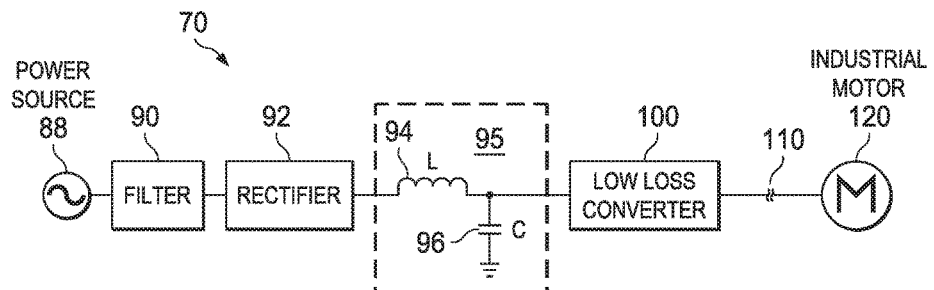
FIG. 1 shows a block diagram of an illustrative electrical system for driving a motor in accordance with various embodiments.

FIG. 1 shows an example of a 3-phase electrical system 70 for driving a motor 120. The system 70 in this example includes a 3-phase power source 88, however, the depiction of a 3-phase electrical system and a 3-phase source is merely illustrative; other embodiments may include other types of power sources, such as a single phase AC source, a direct current (DC) power supply, or any other source of electric power compatible to run an electrical system. The system 70 further includes a filter 90 to reduce, for example, high frequency noise in the 3-phase AC power from the power source 88. In some embodiments, filter 90 may include other types of filters, such as an electromagnetic interference (EMI) filters, radio frequency interference (RFI) filters, etc. The filter 90 further couples to a rectifier 92 which may convert an AC signal to a DC signal. The rectifier 92 may comprise a diode bridge for rectification or comprise other types of rectification circuits to rectify the AC input into a DC output.

In the example of FIG. 1, the rectifier 92 further couples to a low pass filter 95 which includes an inductor 94 (L) and a capacitor 96 (C). Filter 95 may further attenuate higher frequency signals generated by the rectifier 92. Furthermore, the filter 95 couples to a multi-transistor staggered drive converter 100 which may drive a load, such as a motor 120, over a cable 110. The cable 110 can be of varying lengths. In the embodiments disclosed herein, the multi-transistor staggered drive converter 100 is configured to improve switching loss, without increasing switching node slew rate. The converter 100 is further configured to prevent voltage breakdown, cable reflections and higher switching loss at the motor. The multi-transistor staggered drive converter 100 achieves this by employing multiple drivers and switches. The multi-transistor staggered configuration allows faster switching by sharing the overall load current and separating the switching node slew rate. This reduces the amount of current flowing through each switch, which is achieved by driving the switches in a staggered fashion. While the example of FIG. 1 shows the load as a motor 120, the system can be adapted to drive other types of loads as well.

Figure 2:
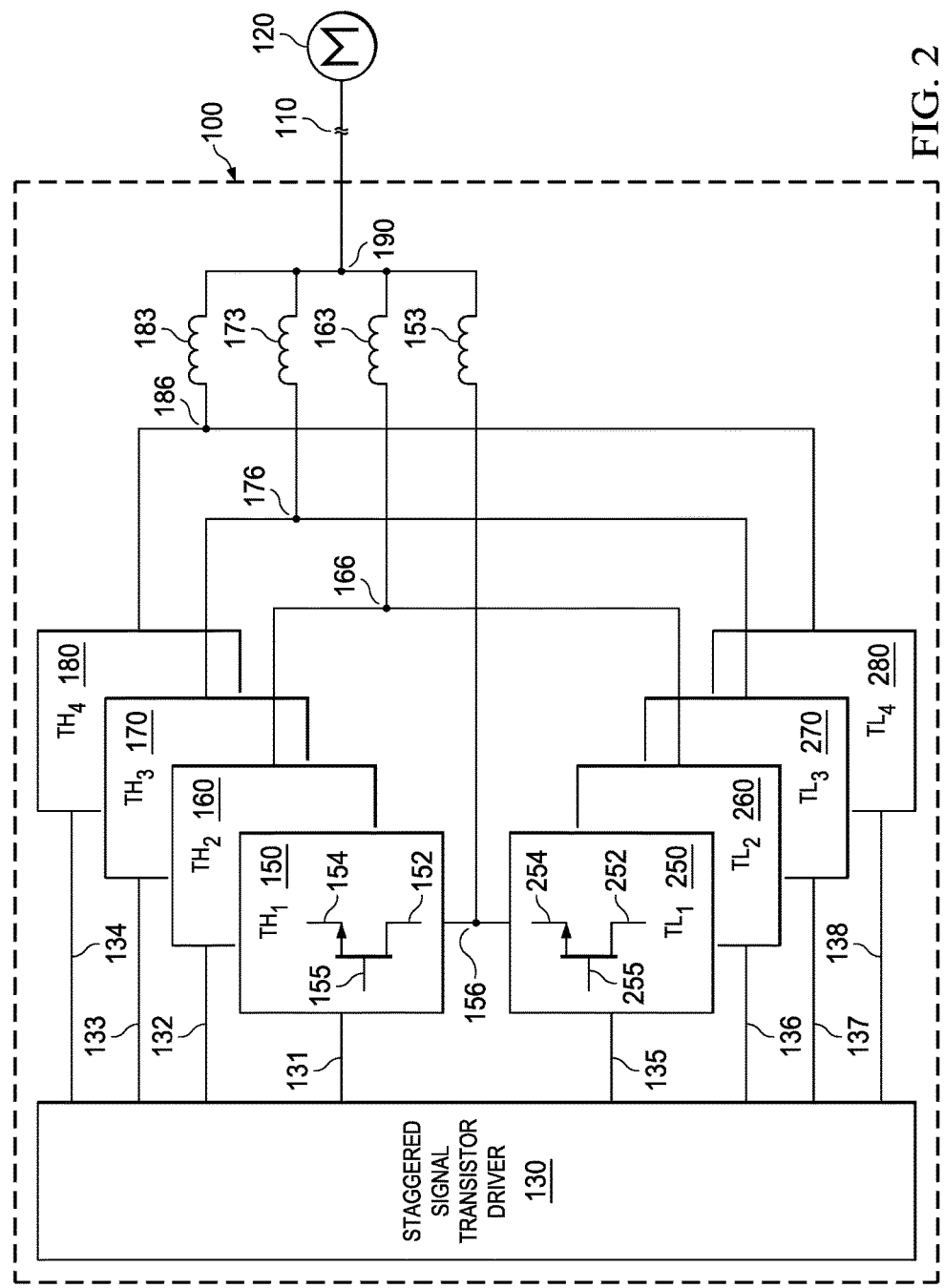
FIG. 2 is an illustrative circuit diagram of at least a portion of a converter of the electrical system of FIG. 1.

FIG. 2 is an illustrative schematic diagram of an embodiment of the multi-transistor staggered drive 100 for driving motor 120 over cable 110. The multi-transistor staggered drive converter 100 in this example includes a staggered signal transistor driver 130, a plurality of switches 150, 160, 170, 180, 250, 260, 270, 280 and impedance devices 153, 163, 173, 183.

The switches may comprise transistors and each transistor may include a control input. In the example of FIG. 2, the transistors employed are metal oxide semiconductor field effect transistors (MOSFETS), and the control input may be a gate. In other embodiments the transistors may be bipolar transistors, in which case the control input may be a base.

In some embodiments, each transistor may include a source, a drain and a gate. For instance, the switch 150 may comprise a drain 154, a source 152 and a gate 155. In some embodiments, the switches comprise silicon carbide (SiC) transistors. In other examples, a switch may be a device that has properties similar to the properties of a transistor or any other semiconductor switching device.

In the example of FIG. 2, the staggered signal transistor driver 130 couples by way of separate conductors to each of the transistor gates. As such, conductors 131, 132, 133, and 134 couple to the gates of the transistors 150-180, respectively. Similarly, conductors 135, 136, 137, and 138 couple to the gates of transistors 250-280, respectively. The staggered signal transistor driver may generate separate signals to drive the gates of the transistors over the conductors 131-138. The drains of the transistors 150-180 are connected to the supply voltage and the sources of the transistors 250-280 are connected to ground. The transistors 150-180 whose drains are connected to a supply voltage are referred to as "high side" transistors and are also designated as high side transistors TH1-TH4, respectively. The transistors 250-280 whose sources are connected to ground are referred to as "low side" transistors and are also designated as low side transistors TL1-TL4, respectively.

In some embodiments, TH1 and TL1 may form a transistor pair. Similarly, TH2 and TL2 form a transistor pair; TH3 and TL3 form a transistor pair; and TH4 and TL4 form a transistor pair. For each transistor pair, the source of the high side transistor connects to the drain of the corresponding low side transistor. For instance, in FIG. 2, the source 152 of TH1 connects to the drain 252 of TL1 to form a node 156. In a similar way, the transistors comprising the other transistor pairs connect with each other thereby forming the nodes 166, 176 and 186. Each node 156-186 may connect to one terminal of an impedance device, which in the example of FIG. 2 is an inductor. Thus node 156 connects to inductor 153. Node 166 connects to inductor 163. Node 176 connects to inductor 173. Node 186 connects to inductor 183. The opposing terminals of the inductors 153-183 are connected together as shown to form an operating node 190 which couples to the motor 120 through cable 110.

Figure 3:
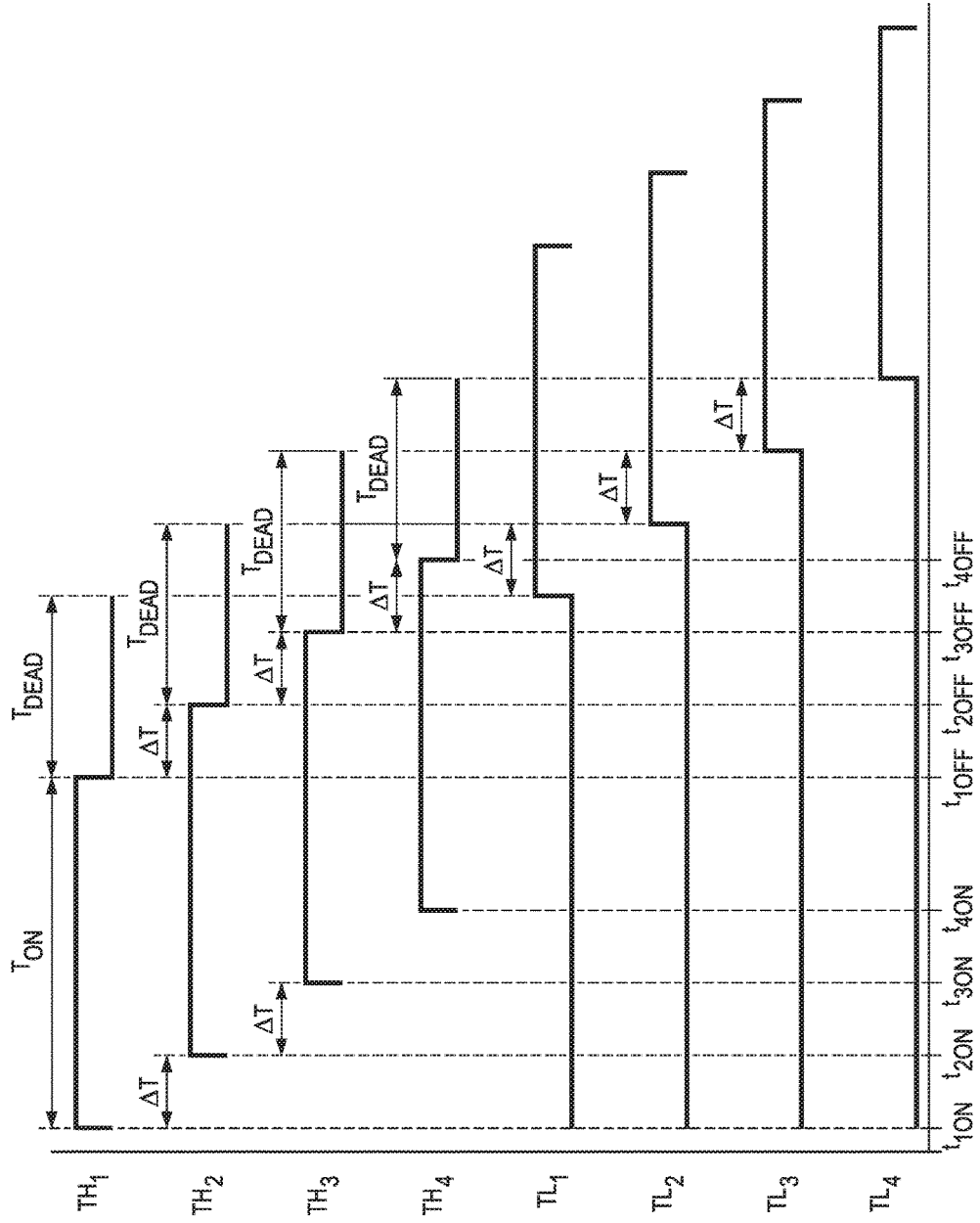
FIG. 3 shows an illustrative timing diagram of implemented by the converter in accordance with various embodiments.

FIG. 3 is an example of a timing diagram illustrating the operation of the multi-transistor staggered drive converter 100 of FIG. 2. As described above in FIG. 2, in one embodiment, each of the transistors is driven by a separate signal generated by the staggered signal transistor driver 130. The Y-axis in FIG. 3 represents the signals generated by the staggered signal transistor driver 130 to the gates of the corresponding transistors and the X-axis depicts time.

In some embodiments, the high and low side transistors are turned ON/OFF by the delay inducing staggered signal transistor driver 130 in a reciprocal and staggered fashion as shown. For example, as depicted in FIG. 3, at time t1ON, the gate of the transistor TH1 receives a signal from the staggered signal transistor driver via conductor 131 which turns TH1 on for a time and the signal is then removed at t1OFF thereby turning TH1 off. The time period TH1 is ON is a pulse width time period $T_{ON}$ (e.g., 50 us). While the transistor TH1 is ON, at time t2ON, the gate of transistor TH2 receives a separate signal from the staggered signal transistor driver 130 to turn ON TH2 for a similar time period $T_{ON}$, albeit staggered from TH1's on state as shown. Similarly at t3ON and at t4ON, high side transistors TH3 and TH4 are respectively turned ON also for the time period $T_{ON}$, albeit staggered as shown. As described for TH1, the transistor TH2 turns OFF at t2OFF, the transistor TH3 and TH4 turns OFF at t3OFF and t4OFF respectively. The turn ON time of each of the transistor TH1, TH2, TH3 and TH4 may depend on the frequency at which the system is running. For example, for a 20 kHz frequency, the turn ON time for the transistors may be in the order of microseconds (e.g., 50 us). The high side transistors TH1-TH4 are sequentially turned ON/OFF in a staggered fashion as shown with a ΔT time delay between the ON/OFF points of consecutive transistors. In some embodiments, the time delay ΔT may be on the order of nanoseconds. The signals generated by the staggered signal transistor driver 130 to control the high side transistors are referred to as delayed high side signals to recognize the time delay ΔT.

The illustrative timing diagram shown in FIG. 3 also illustrates the operation of the low side transistors TL1-TL4. As described above, the high and low side transistors are connected as pairs (FIG. 2) and are therefore turned ON/OFF with respect to each other. In some embodiments, at no point are both the transistors of the corresponding transistor pair turned ON at the same time. For example, for the transistor pair TH1-TL1, both TH1 and TL1 may not be turned ON at the same time. The same is true for transistor pairs TH2-TL2, TH3-TL3 and TH4, TL4.

The low side transistors of the corresponding transistor pair are turned ON by the staggered signal transistor driver 130 following a dead time (Tdead). For example, turning TH1 OFF at t1OFF is followed by a dead time (Tdead) before the corresponding low side transistor TL1 of the TH1-TLl transistor pair is turned ON. Similarly, TL2, TL3 and TL4 are turned ON following their corresponding Tdead time periods. In some embodiments, the time period Tdead may be larger than the ΔT time period of the transistor pair. The signals generated by the staggered signal transistor driver 130 to control the low side transistors are referred to as delayed low side signals.

In some embodiments, the Tdead time period may differ for each of the transistor pairs. For example, the Tdead time period for TH1-TL1 transistor pair may be different from the Tdead time period for TH2-TL2 transistor pair. As discussed above, at no point both transistors in the transistor pair are turned ON or turned OFF at the same time. However, in some embodiments, a high side transistor and a low side transistor of different transistor pair may be turned ON at the same time. For example, in FIG. 3, TH4 and TL1 are on at the same time.

The depiction of four high side transistors and four low side transistors is merely illustrative. In other embodiments, any number (e.g., 2, 3, 4 . . . n, where n is an integer) of high side and low side transistors are possible.

Figure 4:
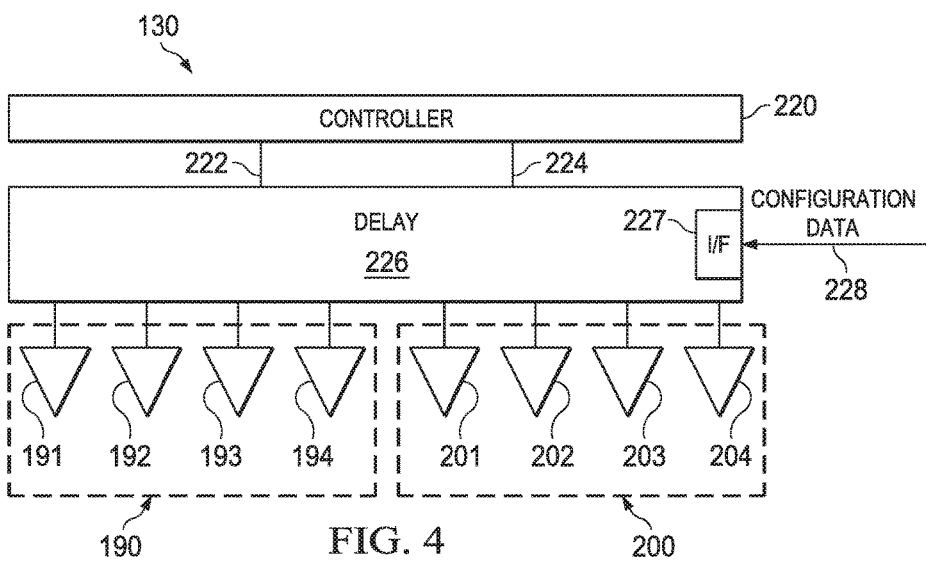
FIG. 4 shows a circuit diagram of an illustrative staggered signal transistor driver with a programmable delay in accordance with some embodiments.

FIG. 4 shows an illustrative embodiment of the staggered signal transistor driver 130. In this example, the staggered signal transistor driver 130 comprises a controller 220, a delay 226 and a plurality of drivers 190 and 200. The drivers 190 (which comprise individual drivers 191-194) connect to corresponding high side transistors and the drivers 200 (which comprise individual drivers 201-204) connect to the low side transistors. Each driver 190, 200 drives the gate of a corresponding transistor. For example, driver 191 connects to the gate of high side transistor TH1. Similarly, drivers 191-194 connect to each of the other high side transistors TH2-TH4, respectively. Similarly, drivers 201-204 connect to each of the low side transistors TL1-TL4, respectively. Each driver 190, 200 as shown receives a signal from the delay 226 to drive the gate of its corresponding high or low side transistor.

The operation of the staggered signal transistor driver 130 is now described with reference to FIGS. 3 and 4. The controller 220 may comprise a programmable logic device, microcontroller, etc. that is configured to generate first and second control signals 222 and 224 respectively. The first control signal 222 is a signal intended to turn ON/OFF the high side transistors, and the second control signal 224 is a signal intended to turn ON/OFF the low side transistors. The delay 226 receives the control signals 222, 224. In response to receiving control signal 222 or 224 from controller 220, the delay 226 may generate a sequence of delayed signals to the various high side and low side transistors to implement the timing sequence illustrated in FIG. 3. In this embodiment, therefore, the controller 220 initiates the firing of the high side (or low side) transistors and the delay 226 turns the corresponding transistors on in the staggered fashion described above. The signals from the various drivers 190 and 200 are the delayed high and low side signals discussed above.

The delay 226 may be preset or configured to implement the timing sequence described herein. For example, the delay 226 may include a digital interface 227 (e.g., an Inter-integrated circuit (I2C) bus) over which timing configuration data 228 (e.g., values of $T_{ON}$, ΔT, Tdead, etc.) can be transmitted to the delay. In some embodiments, the control signals 222, 224 may be a function of the timing configuration data. The delay's digital interface may be coupled to an external programming device such as a computer to program the timing values into the delay 226. In other embodiment, the timing configuration data may be configured into the delay 226 by way of external passive components (e.g., resistors) connected to configuration pins on the delay.

Figure 5:
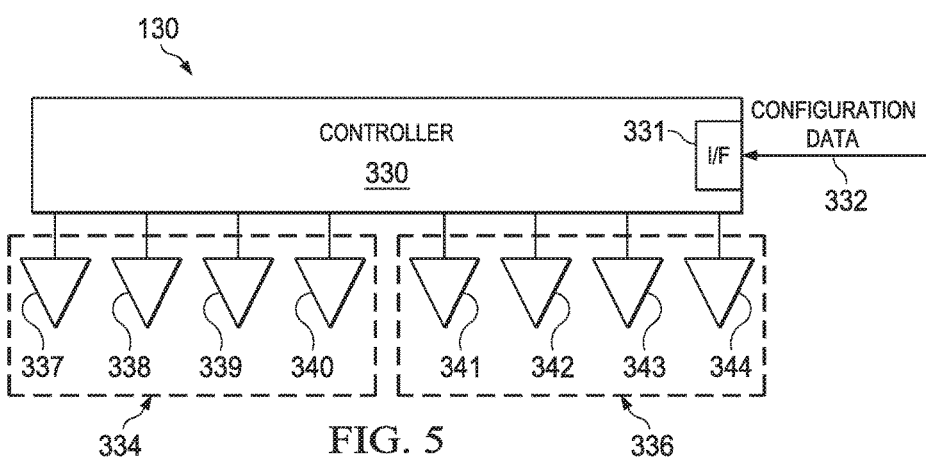
FIG. 5 shows another embodiment of the staggered signal transistor driver with a programmable controller.

FIG. 5 shows an illustrative embodiment of the staggered signal transistor driver 130. In this embodiment, the staggered signal transistor driver comprises of a controller 330 and a plurality of drivers 334 and 336. The drivers 334 (which comprise individual drivers 337-340) connect to corresponding high side transistors and the drivers 336 (which comprise individual drivers 341-344) connect to the low side transistors. For example, driver 337 connects to the gate of high side transistor TH1. Similarly, drivers 338-340 connect to the other high side transistors TH2-TH4, respectively. Similarly, drivers 341-344 connect to the gates of the low side transistors TL1-TL4, respectively. Each driver 334, 336 as shown receives a signal from the controller 330 to drive the gate of its corresponding high or low side transistor. In some embodiments, the signals received from the controller 330 may be a function of the timing configuration data (e.g., values of $T_{ON}$, ΔT, Tdead, etc.).

In operation, the controller 330 may comprise a programmable logic device, microcontroller, etc. that is configured to generate the delayed high and low side signals to the various high side and low side transistors to implement the timing sequence such as that illustrated in FIG. 3.

The controller 330 may be preset or configured to implement the timing sequence described herein. For example, the controller 330 may include a digital interface 331 (e.g., I2C bus) over which the timing configuration data 332 (e.g., values of $T_{ON}$, ΔT, Tdead, etc.) can be transmitted to the controller. The controller's digital interface may be coupled to an external programming device such as a computer to program the timing values into the controller 330. In other embodiment, the timing configuration data may be configured into the controller 330 by way of external passive components (e.g., resistors) connected to configuration pins on the controller.

Figure 6:
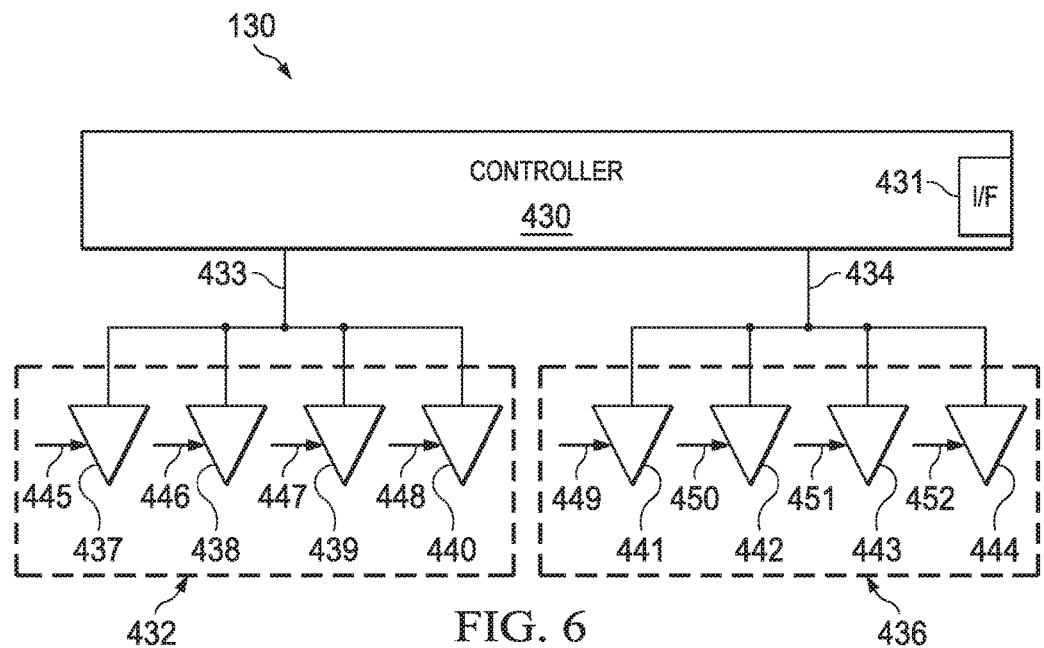
FIG. 6 shows yet another embodiment of the staggered signal transistor driver with a plurality of programmable drivers.

FIG. 6 shows another illustrative embodiment of the staggered signal transistor driver 130. In this embodiment, the staggered signal transistor driver 130 comprises a controller 430 and a plurality of drivers 432 and 436. The drivers 432 (which comprise individual drivers 437-440) connect to corresponding high side transistors and the drivers 436 (which comprise individual drivers 441-444) connect to the low side transistors. For example, driver 437 connects to the gate of high side transistor TH1. Similarly, drivers 438-440 connect to the gates of each of the other high side transistors TH2-TH4, respectively. Similarly, drivers 441-444 connect to the gates of the low side transistors TL1-TL4, respectively. Each driver 432, 436 as shown receives a signal from the controller 430 to drive the gate of its corresponding high or low side transistor.

In the embodiment of FIG. 6, the staggered signal transistor driver's controller 430 may comprise a programmable logic device, microcontroller, etc. that is configured to generate a high side signal and a low side signal. In response to receiving the high side signal 433 and the low side signal 434, the drivers 432 and 436 may generate a sequence of delayed signals to the various high side and low side transistors to implement the timing sequence illustrated in FIG. 3. In this embodiment, therefore, the controller 430 initiates the firing of the high side (or low side) transistors and the drivers 432 and 436 implement the appropriate timing delays to turn on the corresponding transistors in the staggered fashion described above.

The drivers 432 and 436 may be preset or configured to implement the timing sequence described herein. For example, each driver 432 and 436 may include a digital interface (445-452) for each of the driver over which timing configuration data (e.g., values of $T_{ON}$, $\Delta T$, Tdead, etc.) can be transmitted to the driver. The driver's digital interface may be coupled to an external programming device such as a computer to program the timing values into the drivers 432 and 436. In other embodiment, the timing configuration values may be configured into the drivers 432 and 436 by way of external passive components (e.g., resistors) connected to configuration pins on the drivers. The timing configured into each driver may be different than for the other drivers in order to configure the drivers to implement the desired staggered signals to the gates of the transistors. In other embodiment, a Tdead value may be preset or programmed to the controller 430 using controller's digital interface 431. The Tdead value may be configured into the controller 430 by way of external passive components (e.g., resistors) connected to the digital interface on the controller.

Figure 7:
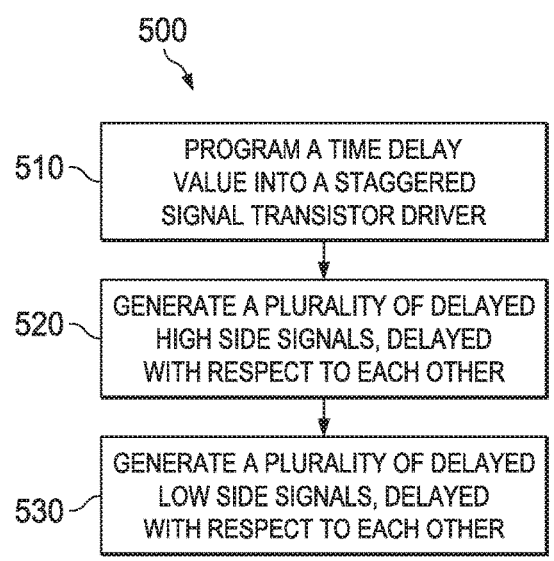
FIG. 7 is a flow diagram of an illustrative process in accordance with various embodiments.

FIG. 7 shows a method 500 in accordance with the disclosed embodiments. The operations may be performed in the order shown, or in a different order. Further, the operations can be performed sequentially or two or more of the operations may be performed concurrently.

The method 500 begins with programming timing configuration data (e.g., values of $T_{ON}$, $\Delta T$, Tdead, etc.) into the staggered signal transistor driver 130 (block 510). FIGS. 4-6 illustrate various examples of programming the timing configuration data into the staggered signal transistor driver 130. The timing configuration data can be programmed over a digital interface or via passive components and into a controller, a delay element, or the transistor drivers themselves.

The illustrative method 500 may continue by generating a plurality of delayed high side signals, delayed with respect to each other by the programmed timing configuration data. Each of the plurality of the delayed high side signal is provided to a gate of a separate high side transistor (block 520). Further, the method includes generating a plurality of delayed low side signals, delayed with respect to each other by the programmed timing configuration data, each of the plurality of the delayed low side signal provided to a gate of separate low side transistor (block 530). For example, the multi-transistor staggered drive may generate separate delayed signals to drive the gates of the transistors over the conductors 131-138.

In some embodiments, the power devices, gate drivers and control/staggered signals described herein are all monolithically integrated into a single silicon integrated circuit with separate terminals connected through impedances to a common switch node.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Apparatus, comprising:
   a plurality of impedances;
   a plurality of transistor pairs, each transistor pair being connected to a corresponding one of the plurality of impedances, each transistor pair including a corresponding high side transistor and a corresponding low side transistor, each transistor having a control input, each transistor pair being coupled to a first terminal of the corresponding impedance at a first node, and second terminals of the plurality of impedances being connected to each other to form a switching node; and
   a staggered signal transistor driver configured to: assert separate delayed high side signals to the control inputs of the plurality of high side transistors, the delayed high side signals being time delayed with respect to each other; and assert separate delayed low side signals to the control inputs of the plurality of low side transistors, the delayed low side signals being time delayed with respect to each other;
   the staggered signal transistor driver being programmable with: at least one pulse width value determining pulse lengths of the delayed high side signals and of the delayed low side signals; at least one time delay value determining time delays between each of successive delayed high side signals and each of successive delayed low side signals, and at least one dead time value determining a dead time between operation of the high side transistor and operation of the low side transistor in the transistor pair.

2. The apparatus of claim 1, wherein the staggered signal transistor driver comprises:
   a controller circuit;
   a plurality of drivers; and
   a delay circuit connected to the controller circuit and, via a separate conductor, to each of the plurality of drivers;
   the delay circuit being configured to generate the delayed high side signals and to provide each of the delayed high side signals to a corresponding conductor to operate a driver connected to that conductor, responsive to a first control signal from the controller circuit; and
   the delay circuit being configured to generate the delayed low side signals and to provide each of the delayed low side signals to a corresponding conductor to operate a driver connected to that conductor, responsive to a second control signal from the controller circuit.

3. The apparatus of claim 2, wherein the delay circuit is configured to implement a time delay for each of at least some of the delayed high side signals and delayed low side signals, and the time delay is programmable in the delay circuit.

4. The apparatus of claim 1, wherein the staggered signal transistor driver comprises:
   a plurality of drivers; and
   a controller circuit connected, via a separate conductor, to each of the plurality of drivers;

the controller circuit being configured to generate the delayed high side signals and to provide each of the delayed high side signals to a corresponding conductor to operate a driver connected to that conductor; and the controller circuit being configured to generate the delayed low side signals and to provide each of the delayed low side signals to a corresponding conductor to operate a driver connected to that conductor.

5. The apparatus of claim 4, wherein the controller circuit is configured to implement a time delay for each of at least some of the delayed high side signals and delayed low side signals, and the time delay is programmable in the controller circuit.

6. The apparatus of claim 1, wherein the staggered signal transistor driver comprises:
   a plurality of high side drivers;
   a plurality of low side drivers; and
   a controller circuit connected, via a separate conductor, to each of the high side drivers and low side drivers;
   the controller circuit being configured to assert: a high side signal to each of the high side drivers; and a low side signal to each of the low side drivers;
   the high side drivers being configured to generate the delayed high side signals responsive to the high side signal; and
   the low side drivers being configured to generate the delayed low side signals responsive to the low side signal.

7. The apparatus of claim 6, wherein the high side drivers configured to implement a time delay for each of at least some of the delayed high side signal, and the low side drivers are configured to implement a time delay for each of at least some of the delayed low side signals, and the time delay is programmable in the high side drivers and the low side drivers.

8. A method comprising:
   programming timing configuration data into a staggered signal transistor driver, including loading a value into a register in the staggered signal transistor driver, the timing configuration data including a time delay value;
   generating, by the staggered signal transistor driver, a plurality of delayed high side signals, delayed with respect to each other by the time delay value, each of the delayed high side signals being provided to a control input of separate high side transistor; and
   generating, by the staggered signal transistor driver, a plurality of delayed low side signals, delayed with respect to each other by the time delay value, each of the delayed low side signals being provided to a control input of a separate low side transistor.

9. The method of claim 8, wherein:
   generating the plurality of delayed high side signals comprises generating successive and time overlapping high side signals to the control inputs of the high side transistors; and
   generating the plurality of delayed low side signals comprises generating successive and time overlapping low side signals to the control inputs of the low side transistors.

10. A method comprising:
   programming timing configuration data into a staggered signal transistor driver, the timing configuration data including a time delay value, a dead time value and a pulse width value;
   generating, by the staggered signal transistor driver, a plurality of delayed high side signals, delayed with respect to each other by the time delay value, each of the delayed high side signals being provided to a control input of separate high side transistor; and
   generating, by the staggered signal transistor driver, a plurality of delayed low side signals, delayed with respect to each other by the time delay value, each of the delayed low side signals being provided to a control input of a separate low side transistor.

11. The method of claim 10, wherein:
   generating the plurality of delayed high side signals comprises generating successive and time overlapping high side signals to the control inputs of the high side transistors; and
   generating the plurality of delayed low side signals comprises generating successive and time overlapping low side signals to the control inputs of the low side transistors.

* * * * *